United States Patent
Ono

(10) Patent No.: US 6,770,218 B1
(45) Date of Patent: Aug. 3, 2004

(54) COMPOSITION FOR POLISHING METAL ON SEMICONDUCTOR WAFER AND METHOD OF USING SAME

(75) Inventor: Fumiyoshi Ono, Shiojiri (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 09/672,776

(22) Filed: Sep. 29, 2000

Related U.S. Application Data

(62) Division of application No. 09/313,356, filed on May 18, 1999.
(60) Provisional application No. 60/132,426, filed on May 4, 1999, and provisional application No. 60/102,000, filed on Sep. 28, 1998.

(30) Foreign Application Priority Data

May 19, 1998 (JP) ............................................ 10-136934
Apr. 22, 1999 (JP) ............................................ 11-115158

(51) Int. Cl.$^7$ .............................................. C09K 13/00
(52) U.S. Cl. ........................ 252/79.1; 438/692; 51/307; 216/89
(58) Field of Search ........................ 438/689, 690–693; 252/79.1–79.5

(56) References Cited

U.S. PATENT DOCUMENTS

| | | | | | |
|---|---|---|---|---|---|
| 5,021,372 | A | * | 6/1991 | Pyzik et al. | 501/97 |
| 5,118,645 | A | * | 6/1992 | Pyzik et al. | 501/97 |
| 5,804,513 | A | * | 9/1998 | Sakatani et al. | 438/693 |
| 6,007,592 | A | * | 12/1999 | Kasai et al. | 51/309 |
| 6,015,506 | A | * | 1/2000 | Streinz et al. | 252/186.1 |
| 6,117,220 | A | * | 9/2000 | Kodama et al. | 106/3 |
| 6,258,137 | B1 | * | 7/2001 | Garg et al. | 51/298 |
| 6,258,140 | B1 | * | 7/2001 | Shemo et al. | 51/308 |
| 6,332,831 | B1 | * | 12/2001 | Shemo et al. | 451/41 |
| 6,398,827 | B1 | * | 6/2002 | Ota et al. | 51/308 |
| 6,436,834 | B1 | * | 8/2002 | Lee et al. | 438/693 |
| 6,440,187 | B1 | * | 8/2002 | Kasai et al. | 51/309 |

FOREIGN PATENT DOCUMENTS

| | | | |
|---|---|---|---|
| JP | 8-83780 | 3/1996 | ......... H01L/21/304 |
| JP | 8-197414 | 8/1996 | |

* cited by examiner

Primary Examiner—Kin-Chan Chen
(74) Attorney, Agent, or Firm—Sughrue Mion, PLLC

(57) ABSTRACT

A slurry for polishing a metal film of a semiconductor device, comprising alumina-type fine particles having specific properties and composition, a polishing accelerator and water.

3 Claims, No Drawings

COMPOSITION FOR POLISHING METAL ON SEMICONDUCTOR WAFER AND METHOD OF USING SAME

CROSS REFERENCE TO RELATED APPLICATIONS

This is a Divisional of Application Ser. No. 09/313,356, filed May 18, 1999, the disclosure of which is incorporated herein by reference, which is an application filed under 35 U.S.C. § 111(a) claiming benefit pursuant to 35 U.S.C. § 119(e)(1) of the filing date of the Provisional Applications 60/102,000, filed Sep. 28, 1998 and Ser. No. 60/132,426, filed May 4, 1999, pursuant to 35 U.S.C. § 111(b).

BACKGROUND OF THE INVENTION

1. Field of the Invention

The present invention relates to a polishing composition for selectively polishing a metal film on a semiconductor wafer and a polishing method of using the composition.

2. Description of the Related Art

A typical semiconductor wafer comprises a substrate such as a silicon or gallium arsenide wafer, and a plurality of integrated circuits are formed on the substrate. The integrated circuits are chemically or physically integrated on the substrate by patterning the regions in the substrate and layers on the substrate. The layers are generally formed of a material having any one of a conductivity, an insulating property and a semiconducting property. In order to obtain semiconductor devices at a high yield, it is very important to start from a flat semiconductor wafer. To this purpose, the surface or a certain part of the semiconductor wafer must be often polished.

According to the surface formation by conventional techniques, the upper surface of the wafer is disadvantageously left to have a topography still in a very irregular state such that upheavals, uneven height regions, troughs, trenches and other similar surface irregularities are present. Therefore, the surface must be planalized overall so as to ensure a sufficiently large depth of focus in photolithography and to remove the irregularity and surface defects during various steps in the production process. For attaining flatness on the wafer surface, several polishing methods are known and a chemical/mechanical planalization or polishing (CMP) is used over a wide range in the treatment for rendering the wafer surface flat during various steps in the production of a device, so that the yield, performance and reliability can be improved.

The slurry used for this chemical/mechanical polishing is formed from an acidic or basic solution containing abrasive grains such as silica, alumina, zirconia, ceria or titania.

The CMP technique is essential in the production process of a semiconductor device, particularly in the planalization of an interlayer insulating film for the formation of a multi-layer interconnection, in the formation of a conductive plug which is a metal, or in the formation of flush wiring.

With respect to the slurry for CMP used in the formation of a conductive plug which is a metal film comprising tungsten, aluminum, copper, titanium or an alloy thereof, JP-A-8-83780 (the term "JP-A" as used herein means an "unexamined published Japanese patent application (Kokai)") discloses an abrasive composition containing a polishing accelerator such as an aminoacetic acid and/or amidosulfuric acid or an oxidizing agent, and a chemical reagent such as benzotriazole, and JP-A-8-197414 discloses a slurry containing a metal oxide particle such as fumed silica or fumed alumina having specific properties.

Conventional slurries for polishing a metal film of a semiconductor device are disadvantageous in that both the polishing rate for a metal film and the ratio (selection ratio) of the polishing rate for a metal film to the polishing rate for an oxide film (insulting layer) such as silica cannot be increased or, even if the polishing rate is high, a large number of scratches are generated on the polished surface.

The object of the present invention is to provide a slurry composition for polishing a metal film on a semiconductor substrate, which ensures a high polishing rate for a metal film, a high selection ratio, and reduction in the generation of scratches on the polished surface, as well as a method for polishing using the above composition.

SUMMARY OF THE INVENTION

As a result of extensive studies to achieve the above-described object, the present inventor has made the present invention.

More specifically, the present invention provides a slurry composition for polishing a metal film on a semiconductor substrate, comprising alumina-type fine particles containing or not containing alumina hydrate, a polishing accelerator and water, the alumina-type fine particles having an $\alpha$ conversion ratio of from 65 to 90% and a specific surface area of from 30 to 80 $m^2/g$.

By the present invention, the polishing work can be favored with a high polishing rate for a metal film, particularly a high selection ratio, and reduction in scratches on the polished surface.

DETAILED DESCRIPTION OF THE INVENTION

The alumina-type fine particles containing or not containing an alumina hydrate for use in the present invention are described below.

The alumina-type fine particles can be produced by preparing an alumina sol, forming it into a gel while heating, subjecting the gel to calcination and then firing, and crushing the fired powder in a medium stirring-type grinding machine.

To speak more specifically, a sol-form aqueous solution of a commercially available pseudo boehmite is prepared in a concentration of from 2 to 60 wt % using an inorganic acid such as nitric acid, or an organic acid, or the like. The amount of peptizer added is preferably on the order of from $1\times10^{-2}$ to $10^{-5}$ mol/g, and the pH of the solid is preferably on the order of from 3 to 4.

If the amount of the peptizer added is less than $1\times10^{-5}$ mol/g, the peptization does not proceed satisfactorily and the fine particles after firing are deteriorated in their properties, whereas if the added amount is excessively large, the sol is abruptly gelled and the fired fine particles are also disadvantageously deteriorated in their properties.

The thus-prepared sol is dried to reduce the water content and is thereby formed into a dry gel. The gel obtained is calcined at from 500 to 800° C. for about 1 hour and then preferably, crashed to have a gain size of about 1 mm or less.

After the calcination, the gel is fired at from 1,000 to 1,600° C., preferably at from 1,100 to 1,300° C., for from 1 to 3 hours. If the firing temperature is less than 1,000° C., the α-alumina conversion ratio is low and for elevating the ratio, a long period of time is necessary, whereas if it exceeds 1,600° C., the fired fine particles may be disadvantageously sintered.

After the firing, the fine particles are preferably wet-treated by crushing or cracking in an ordinary manner, such as pot milling, to have a maximum particle size of 100 μm or less.

Thereafter, the fine particles are further pulverized by a medium stirring-type grinding machine such as an attritor, a bead mill, a Dynomill, an apex mill or a co-ball mill.

The conditions for the treatment in a medium stirring-type grinding machine are as follows.

| | |
|---|---|
| (1) Rotation number: | from 1,000 to 2,000 rpm |
| (2) Pulverization time: | from 2 to 24 hours |
| (3) Sample concentration: | from 25 to 65 wt % |
| (4) Sample amount: | from 1 to 50 times the mill capacity |
| (5) Grinding medium: | |
| (a) sintered zirconia, alumina or silicon nitride ball | |
| (b) ball size: | from 0.5 to 3 mmφ |
| (c) ball amount: | from 70 to 80% of the mill capacity. |

The fine particles obtained by the above-described production process are a mixture of alumina and alumina hydroxide, more specifically, a mixture of α-alumina and an intermediate alumina showing a peak at 2θ=67.3° at the measurement by X-ray diffraction (Cu and Kα rays), or alumina-type fine particles containing bayerite in addition to those aluminas.

The alumina-type fine particles have the following properties.

When a peak height (a) at 2θ=68.2° corresponding to α-alumina and a peak height (b) at 2θ=67.3° corresponding to an intermediate alumina are determined by X-ray diffraction measurement with Cu and Kα rays, the value according to the following expression, namely, the α conversion ratio is from 65 to 90%.

$$a \text{ conversation ratio } (\%) = \frac{a}{a+b} \times 100$$

The alumina-type fine particles have a BET specific surface area of from 30 to 80 m²/g.

The alumina-type fine particles preferably have a maximum grain size of 1.0 μm or less, more preferably 0.5 μm. If the maximum grain size exceeds 1.0 μm, scratches increase on the metal film or insulating film and furthermore, the above-described selection ratio disadvantageously decreases.

In order to have a maximum grain size of a predetermined value or less, coarse particles are preferably removed by decantation or the like.

The alumina-type fine particles preferably have an average size of from 0.05 to 0.5 μm, more preferably from 0.10 to 0.30 μm, the most preferably 0.15 to 0.30 μm.

If the average size is less than 0.05 μm, the mechanical polishing force decreases and the metal film can be difficult to shave, whereas if it exceeds 0.5 μm, the polishing force increases but generation of scratches on the metal film or insulating film increases.

The concentration of the alumina-type fine particles in the polishing composition of the present invention is preferably from 0.5 to 20% by weight, more preferably from 1 to 10% by weight. If the concentration is less than 0.5% by weight, the polishing rate decreases. If the concentration exceeds 20% by weight, the polishing rate does not increase and the selection ratio decreases. Particularly, a range of from 1 to 10% by weight is optimum from the viewpoints of the polishing rate and the selection ratio.

The α conversion ratio of the alumina-type fine particles of the present invention is optimum in a range of from 65 to 90%. If the a conversion ratio exceeds 90%, the scratches formed on the polished surface increase. If the a conversion ratio is less than 65%, the polishing rate decreases. Outside of the range is not preferred.

The polishing accelerator for use in the present invention is described below. The polishing accelerator which can be used in the present invention is not particularly limited, however, $Fe(NO_3)_3$ type or $H_2O_2$ type oxidizing agents, inorganic polishing accelerators such as ammonium cerium (IV) nitrate, ammonium cerium(IV), sulfate, cerium (IV) sulfate and cerium (IV) chloride, organic polishing accelerators such as organic acids having a molecular weight of 100 to 300 of carboxylic acid, or the like are preferred.

When the inorganic polishing accelerator is used, the amount of the accelerator added is preferably from 2 to 7% by weight based on the polishing composition. If the added amount is less than 2 wt % high-speed polishing becomes difficult, whereas if it exceeds 7 wt %, the effect due to increase in the added amount is not increased and this is not preferred in view of profitability. In the case of the organic polishing accelerator, the amount of the polishing accelerator added is preferably from 0.1 to 5% by weight based on the polishing composition.

The slurry of the present invention may contain various known additives commonly added to the polishing slurry composition, such as a dispersant, a buffer, a surface active agent and a viscosity controlling agent, within the range of not impairing the preferred properties of the slurry.

The polishing composition of the present invention may be preferably used for polishing a metal film on a semiconductor substrate. The metal film includes tungsten, aluminum, copper, titanium, tantalum, etc., and alloys of these metals. The polishing composition of the present invention provides a high polishing rate of a metal film. The polishing composition of the present invention is particularly useful in selectively polishing a metal film of a semiconductor substrate having a metal film and an insulating film thereon. The insulating film may be an oxidized silicon or nitrized silicon film. The polishing composition of the present invention provides a high selection ratio of polishing a metal film to polishing an insulating layer, for example, above 200, even above 400 for W/SiO$_2$, above 600 for Cu/SiO$_2$, and above 800 for Co/SiO$_2$.

For example, when a metal film is formed on an insulating layer as above, which in turn is formed on a semiconductor substrate, since the polishing selection ratio between a metal film and an insulating layer is high in the polishing composition of the present invention, the finish point of polishing a metal film can be easily detected and controlled without excessive polishing of the underlying insulating layer.

EXAMPLES

The present invention is described in greater detail below by referring to the Examples, however, the present invention should not be construed as being limited to these Examples.

Example 1

A pseudo boehmite (puarl SB, produced by CONDEA) was formed into a 20 wt % water dispersion slurry and thereto a 65% diluted nitric acid was added in an amount of 0.0625 ml/g based on the solid content, to form a sol.

After the slurry was completely formed into a sol, the sol was transferred to a stainless steel vat and the vat was placed in a dryer kept at 120° C. to form a dry gel. The dry gel was crushed by a pin mill to have a size of 1 mm or less and calcined at at 650° C. for 1 hour.

The powder obtained was further fired at 1,200° C. for 1 hour. The resulting fired powder had an a conversion ratio of 98% and a specific surface area of 7 m$^2$/g.

This fired powder was wet grained in an ordinary pot mill to have a maximum particle size of 100 $\mu$m or less.

Thereafter, the powder was pulverized for 8 hours in an apex mill (manufactured by Kotobuki Giken KK) having an inner volume of 1 L, containing 2.5 kg of 0.8-mm$\phi$ zirconia balls as the milling medium and rotating at 1,500 rpm, while circulating 1.8 kg of a slurry (slurry concentration: 33 wt %) consisting of 600g of alumina and 1,200g of water (circulation amount: 1 kg/min, amount of slurry residing in the grinder: 200g).

The alumina-type fine particles obtained had an a conversion ratio of 87% and a specific surface area of 63 m$^2$/g. It was confirmed by x-ray diffraction with Cu and K$\alpha$ rays that peaks are present at 2$\theta$=68.2° (corresponding to $\alpha$-alumina) and 2$\theta$=67.3° (corresponding to intermediate alumina) and also confirmed by the absorption peak with FT-IR that bayerite was contained. The fine particles had an average particle size of 0.22 $\mu$m measured by the dynamic light scattering method (MICROTRAC UPA).

Then, an aqueous slurry containing, in terms of the slurry concentration, 2 wt % of the alumina-type fine particles obtained above and 3.5 wt % of iron nitrate enneahydrate (guaranteed reagent, produced by Kanto Kagaku KK) as the polishing accelerator was prepared and evaluated on the polishing properties under the following conditions. The results obtained are shown in Table 1.

| Polishing Conditions | |
| --- | --- |
| Work: | obtained by adhering 5 sheets of pellets made of tungsten (purity: 99.9 wt %) each having a size of 20 mm$\phi$ and 5 mm thickness on a glass-made substrate of 110 mm$\phi$ and 5 mm thickness |
| Pad: | two layer-type pad for polishing semiconductor device (Rodel Nitta KK, IC1000/Suba400) |
| Polishing machine: | single side polishing machine (Model 7941-338, manufactured by Marumoto Kogyo KK, table diameter: 320 mm) |
| Revolution number of table: | 60 rpm |
| Work pressure: | 400 gf/cm$^2$ |
| Slurry feeding rate: | 10 ml/min |
| Polishing time: | 15 minutes |
| Evaluation Item | |
| Polishing rate: | The change in the weight of the work before and after the polishing was measured and the polishing rate was calculated therefrom in terms of thickness. |

In order to evaluate the selection ratio of the polishing of the tungsten to the insulating film, the same slurry was examined on the polishing performance for a commercially available thermally oxidized film formed on a silicon substrate by the following method.

| Polishing Conditions | |
| --- | --- |
| Work: | obtained by forming thermally oxidized film (thickness: about 1 $\mu$m) on a silicon wafer of 6 inches $\phi$ and 625 $\mu$m in thickness (commercially available product) |
| Pad: | two layer-type pad for polishing semiconductor device (the same as above) |
| Polishing machine: | single side polishing machine for polishing semiconductor device, Model SH-24, manufactured by Speedfam KK, table diameter: 320 mm |
| Revolution number of table: | 30 rpm |
| Work pressure: | 400 gf/cm$^2$ |
| Slurry feeding rate: | 100 ml/min |
| Polishing time: | 1 minute |
| Evaluation Item | |
| Polishing rate: | measured by a light interference-type film thickness measuring apparatus |
| Evaluation of scratches: | The number of scratches per 10 visual fields was measured by the observation (x50) through a differential interference microscope and evaluated into the following 5 grades:<br>1: good (from 0 to 1 scratch),<br>2: slightly good (from 2 to 9 scratches),<br>3: normal (from 10 to 49 scratches),<br>4: slightly many (from 50 to 99 scratches),<br>5: many (100 or more scratches). |

As a result of evaluation using the above-described polishing method and conditions, the polishing rate for tungsten was found to be a value as large as 4,800 Å/min.

The polishing rate for the thermally oxidized film was a very low value of 8 Å/min. Accordingly, the polishing selection ratio of the tungsten to the insulating film was 600. The level in the evaluation of scratches was 2.

Example 2

A slurry was prepared using the same operation and conditions as in Example 1 except that the pulverization time in an apex mill was 4 hours, and evaluated on the polishing performance in the same manner as in Example 1. The results obtained are shown in Table 1.

In the alumina-type fine particle prepared in Example 2, bayerite was not detected by FT-IR. The alumina fine particles had an average particle size of 0.25 µm.

Example 3

A slurry was prepared using the same operation and conditions as in Example 1 except for changing the firing temperature from 1,200° C. to 1,125° C., and was evaluated on the polishing performance in the same manner as in Example 1. The results obtained are shown in Table 1.

In the alumina-type fine particle prepared in Example 3 bayerite was detected. The fine particles had an average particle size of 0.19 µm.

Example 4

A slurry was prepared using the same operation and conditions as in Example 1 except for changing the firing temperature from 1,200° C. to 1,100° C. and the pulverization time in an apex mill from 8 hours to 4 hours, and evaluated on the polishing performance in the same manner as in Example 1. The results obtained are shown in Table 1.

In the alumina-type fine particles prepared in Example 4, bayerite was detected. The fine particles had an average particle size of 0.20 µm.

Examples 5 to 7

Slurries were prepared using the same alumina-type fine particles as in Example 1 by varying the polishing accelerator. The kind of the polishing accelerator and the slurry concentration at the polishing are shown in Table 1. The slurries were evaluated on the polishing performance in the same manner as in Example 1. The results obtained are shown in Table 1.

Example 8

A slurry was obtained by the same operation as in Example 1 and evaluated on the polishing performance in the same manner as in Example 1 except for using aluminum (purity: 99.99%) in place of tungsten as the metal pellet. The results obtained are shown in Table 1.

Example 9

A slurry was evaluated on the polishing performance in the same manner as in Example 8 except for using copper (purity: 99.95%) in place of tungsten as the metal pellet. Other conditions were the same as in Example 1. The results obtained are shown in Table 1.

Comparative Example 1

Iron nitrate enneahydrate as the polishing accelerator was added to a slurry WA-400 produced by Cabot Corporation (specific surface area of the solid content contained in slurry: 50 m$^2$/g, crystal structure: intermediate alumina: grain size $d_s$: 0.15 µm) to have a slurry concentration at the polishing shown in Table 1 and evaluated on the polishing performance in the same manner as in Example 1. The results obtained are shown in Table 1.

TABLE 1

| Example No., Comparative Example No. | Properties of Alumina-Type Fine Particle | | Polishing Accelerator | | Kind of Metal Polished | Polishing Rate (Å/min) | | Selection Ratio | Evaluation of Scratch |
| --- | --- | --- | --- | --- | --- | --- | --- | --- | --- |
| | α Conversion Ratio (%) | Specific Surface Area (m$^2$/g) | Kind | Concentration at the Evaluation of Polishing | | Metal | Thermal Oxide Film | | |
| Example 1 | 87 | 62 | iron nitrate enneahydrate | 3.5 wt % | tungsten | 4800 | 8 | 600 | 2 |
| Example 2 | 90 | 31 | iron nitrate enneahydrate | 3.5 wt % | tungsten | 5400 | 12 | 450 | 3 |
| Example 3 | 68 | 63 | iron nitrate enneahydrate | 3.5 wt % | tungsten | 3900 | 7 | 560 | 1 |
| Example 4 | 68 | 77 | iron nitrate enneahydrate | 3.5 wt % | tungsten | 4400 | 9 | 490 | 2 |
| Example 5 | 87 | 62 | ammonium cerium (IV) nitrate | 5.0 wt % | tungsten | 5000 | 20 | 250 | 3 |
| Example 6 | 87 | 62 | ammonium cerium (IV) sulfate | 5.0 wt % | tungsten | 2800 | 15 | 190 | 2 |
| Example 7 | 87 | 62 | cerium (IV) sulfate | 5.0 wt % | tungsten | 2600 | 6 | 430 | 2 |
| Example 8 | 87 | 62 | iron nitrate enneahydrate | 3.5 wt % | aluminum | 6000 | 8 | 750 | 3 |
| Example 9 | 87 | 62 | iron nitrate enneahydrate | 3.5 wt % | copper | 7500 | 8 | 940 | 2 |
| Comparative Example 1 | 3% or less | 50 | iron nitrate enneahydrate | 3.5 wt % | tungsten | 4000 | 45 | 90 | 5 |

From the above, it is demonstrated that the polishing slurry of the present invention is advantageous in that the polishing rate for a metal film is high, the polishing selection ratio as a ratio of the polishing rate for a metal film to that for an insulating oxide film is large and the generation of scratches on the polished surface is extremely reduced.

What is claimed is:

1. A method for polishing a metal film on a semiconductor substrate, comprising the steps of:
    providing a semiconductor substrate comprising a metal film and an insulating film therein;
    providing a polishing composition comprising alumina fine particles containing or not containing aluminum hydrate, a polishing accelerator and water, said alumina fine particles having an α conversion ratio of from 68 to 87% and a specific surface area of from 31 to 77 m$^2$/g, and mechanochemically polishing a metal film on said semiconductor substrate with said polishing composition, wherein said metal of said metal film selected from the consisting of tungsten, aluminum, copper and alloys thereof.

2. The method according to claim 1, wherein said insulating layer is made of a material selected from oxided silicon and nitrided silicon.

3. The method according to claim 1, wherein said metal film is of tungsten said insulating layer is of oxidized silicon, and a selection ratio of polishing between said tungsten and oxidized silicon is above 200.

* * * * *